(12) United States Patent
Wu et al.

(10) Patent No.: US 11,360,334 B2
(45) Date of Patent: Jun. 14, 2022

(54) DISPLAY DEVICE, DISPLAY SYSTEM AND DISPLAY METHOD (71) Applicants: Hefei BOE Display Lighting Co., Ltd., Anhui (CN); BOE Technology Group Co., Ltd., Beijing (CN)

(72) Inventors: Bo Wu, Beijing (CN); Yaling Kang, Beijing (CN); Zuchuan Shi, Beijing (CN); Peina Wang, Beijing (CN)

(73) Assignees: HEFEI BOE DISPLAY LIGHTING CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 46 days.

(21) Appl. No.: 16/966,608

(22) PCT Filed: Dec. 18, 2019

(86) PCT No.: PCT/CN2019/126234
§ 371 (c)(1),
(2) Date: Jul. 31, 2020

(87) PCT Pub. No.: WO2020/140756
PCT Pub. Date: Jul. 9, 2020

(65) Prior Publication Data
US 2021/0080762 A1 Mar. 18, 2021

(30) Foreign Application Priority Data
Jan. 2, 2019 (CN) .......................... 201910002200.3

(51) Int. Cl.
G02F 1/03 (2006.01)
F21V 8/00 (2006.01)
(Continued)

(52) U.S. Cl.
CPC ........... *G02F 1/0316* (2013.01); *G02B 6/005* (2013.01); *G02F 1/0327* (2013.01);
(Continued)

(58) Field of Classification Search
CPC ... H01L 27/3232; G02B 6/005; G02B 6/0086; G02F 1/133521; G02F 1/0316;
(Continued)

(56) References Cited

U.S. PATENT DOCUMENTS

| 5,452,113 | A |   | 9/1995 | Ikeno |           |
|-----------|---|---|--------|-------|-----------|
| 5,548,420 | A | * | 8/1996 | Koshimizu | G02F 1/132 |
|           |   |   |        |       | 349/168   |
| 5,872,609 | A | * | 2/1999 | Hiji | G02F 1/13342 |
|           |   |   |        |       | 349/123   |

FOREIGN PATENT DOCUMENTS

| CN | 102159881 A | * | 8/2011 | ............ H01L 33/60 |
| CN | 102955315 A |   | 3/2013 | |

(Continued)

OTHER PUBLICATIONS

First Office Action dated Apr. 2, 2020, for corresponding Chinese application 201910002200.3.
(Continued)

*Primary Examiner* — Hoan C Nguyen
(74) *Attorney, Agent, or Firm* — Nath, Goldberg & Meyer; Joshua B. Goldberg (57) ABSTRACT The present disclosure provides a display device, including: a light emitting device and a light adjusting layer, the light adjusting layer being on a light emitting side of the light emitting device, and the light emitting device being configured to generate and emit light having a wavelength in a wavelength range of visible light, wherein the light adjusting layer is configured to block light having a wavelength in a partial wavelength range of blue light from passing through
(Continued)

when subjected to an external stimulus and allow the light having the wavelength in the partial wavelength range of blue light to pass through when the external stimulus is removed, and the light adjusting layer includes a responsive photonic crystal.

12 Claims, 3 Drawing Sheets

(51) Int. Cl.
  *G02F 1/1335* (2006.01)
  *H01L 27/32* (2006.01)
(52) U.S. Cl.
  CPC .... *G02F 1/133514* (2013.01); *H01L 27/3232* (2013.01); *G02F 2202/32* (2013.01)
(58) Field of Classification Search
  CPC ......... G02F 1/133504; G02F 1/133509; G02F 1/0327; G02F 1/133514; G02F 2201/307; G02F 2202/32
  See application file for complete search history.

(56) References Cited

FOREIGN PATENT DOCUMENTS

| | | | |
|---|---|---|---|
| CN | 103376552 | A | 10/2013 |
| CN | 103436965 | A | 12/2013 |
| CN | 108594345 | A | 9/2018 |
| CN | 109061936 | A | 12/2018 |
| CN | 109491145 | A | 3/2019 |
| JP | 2006227220 | A * | 8/2006 |
| KR | 20090118768 | A | 11/2009 |

OTHER PUBLICATIONS

Second Office Action dated Dec. 30, 2020, for corresponding Chinese application 201910002200.3.

* cited by examiner

DISPLAY DEVICE, DISPLAY SYSTEM AND DISPLAY METHOD

CROSS REFERENCE TO RELATED APPLICATION

This is a National Phase Application filed under 35 U.S.C. 371 as a national stage of PCT/CN2019/126234, filed on Dec. 18, 2019, an application claiming priority to Chinese patent application No. 201910002200.3, filed on Jan. 2, 2019, the entire contents of which are incorporated herein by reference.

TECHNICAL FIELD

The present disclosure belongs to the field of display technologies, and in particular, to a display device, a display system, and a display method.

BACKGROUND

With the advancement of electronic technology, digital apparatuses having a display panel, such as computers, televisions, smart phones, portable game players, and the like, have seeped into people's daily lives. Due to the fact that the time for watching the display panel is greatly increased, blue light in the light emitted from the display panel may have adverse effects on eyes. Particularly, blue light with the wavelength of 420 nm-450 nm may increase the toxin amount of a macular area in the eyes, cause macular degeneration of the eyes, and thus seriously threaten the health of the eyes.

SUMMARY

In a first aspect, an embodiment of the present disclosure provides a display device, including: a light emitting device and a light adjusting layer, the light adjusting layer being on a light emitting side of the light emitting device, and the light emitting device being configured to generate and emit light having a wavelength in a wavelength range of visible light, wherein the light adjusting layer is configured to block light having a wavelength in a partial wavelength range of blue light from passing through in response to the light adjusting layer being subjected to an external stimulus and allow the light having the wavelength in the partial wavelength range of blue light to pass through in response to removing the external stimulus, and the light adjusting layer includes a responsive photonic crystal.

In some embodiments, the light adjusting layer includes: an electrically responsive photonic crystal.

In some embodiments, the light adjusting layer includes: a first electrode, an electrolyte layer, an electroactive layer, and a second electrode that are stacked;

the electrolyte layer and the electroactive layer are between the first electrode and the second electrode, an electric field is formed between the first electrode and the second electrode in response to different voltages being applied to the first electrode and the second electrode; and the electrolyte layer and the electroactive layer are configured such that electrolyte in the electrolyte layer flows into the electroactive layer to cause that a lattice parameter of the photonic crystal in the electroactive layer is changed, and the photonic crystal blocks the light having the wavelength in the partial wavelength range of blue light from passing through, in response to different voltages being applied to the first electrode and the second electrode to form the electric field; and the electrolyte flowing into the electroactive layer is drained out to cause that the lattice parameter of the photonic crystal in the electroactive layer is restored to an original state, and the photonic crystal allows the light having the wavelength in the partial wavelength range of blue light to pass through, in response to removing the electric field.

In some embodiments, the display device further includes a liquid crystal display panel, the light emitting device is a backlight module, and the liquid crystal display panel is on a light emitting side of the backlight module.

In some embodiments, the liquid crystal display panel includes a first display substrate and a second display substrate assembled to form a cell, the first display substrate including a first substrate, the second display substrate including a second substrate on a side of the first substrate away from the backlight module, wherein the light adjusting layer is between the backlight module and the first substrate, or the light adjusting layer is on a side of the second substrate away from the backlight module, or the light adjusting layer is between the first substrate and the second substrate.

In some embodiments, the display device is an organic light emitting diode display device, the organic light emitting diode display device includes an organic light emitting diode display panel including an organic light emitting diode array, and the light emitting device is the organic light emitting diode array.

In some embodiments, the partial wavelength range is from 420 nm to 450 nm.

In a second aspect, an embodiment of the present disclosure provides a display system, including the display device described above.

In some embodiments, the display system further includes a controller and a voltage generator;

the controller is configured to control whether the voltage generator generates a voltage in response to an operation of a user; and the voltage generator is configured to apply an external stimulus to the light adjusting layer by generating the voltage, and to stop applying the external stimulus to the light adjusting layer by not generating the voltage.

In some embodiments, the light adjusting layer includes a first electrode, an electrolyte layer, an electroactive layer and a second electrode that are stacked, the voltage generator is electrically coupled to the first electrode and the second electrode, and the voltage generator applies the external stimulus to the light adjusting layer by respectively applying different voltages to the first electrode and the second electrode to form an electric field between the first electrode and the second electrode, and stops applying the external stimulus to the light adjusting layer by stopping applying the voltages to the first electrode and the second electrode.

In some embodiments, the controller includes: a physical key or a virtual key.

In a third aspect, an embodiment of the present disclosure provides a display method, the display method being based on the above display device, and the display method includes:

in a case that the display device is expected to be in an eye protection display mode, applying the external stimulation to the light adjusting layer, so that the light adjusting layer blocks light having the wavelength in the partial wavelength range of blue light from passing through;

in a case that the display device is expected to be in a normal display mode, stopping applying the external stimulus to the light adjusting layer, so that the light adjusting layer allows the light having the wavelength in the partial wavelength range of blue light to pass through.

DETAILED DESCRIPTION

In order to make those skilled in the art better understand the technical solutions of the present invention, a display device, a display system and a display method provided by the present disclosure are described in detail below with reference to the accompanying drawings.

At present, in order to avoid blue light damaging user's eyes, generally, a blue light filter film for filtering out part of blue light is attached to the surface of the display panel, thereby achieving the purpose of protecting eyes. However, after the blue light filter film is attached, the overall brightness of the display panel is reduced, the color gamut of the display screen is reduced, and the display quality of the display panel is affected; in this case, if the user wants to experience a normal display screen with high brightness and high color gamut, the blue light filter film must be torn off. Therefore, when the user wants to switch the display device between "an eye protection display mode" and "a normal display mode", the user needs to repeatedly perform the operations of attaching and tearing the film, which is very inconvenient for use.

The technical solution of the present disclosure can effectively improve above-mentioned problem, so that the user can conveniently control the display device to switch between "the eye protection display mode" and "the normal display mode".

Figure 1:
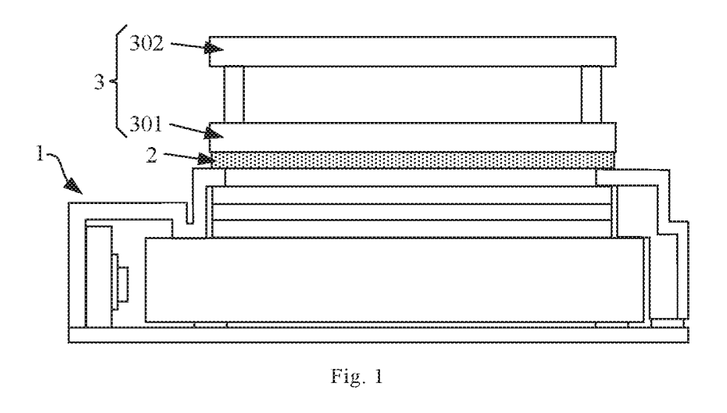
FIG. 1 is a schematic cross-sectional view of a display device according to an embodiment of the disclosure.

FIG. 1 is a schematic cross-sectional view of a display device according to an embodiment of the disclosure. As shown in FIG. 1, the display device includes: a light emitting device 1 and a light adjusting layer 2, the light adjusting layer 2 is on a light emitting side of the light emitting device 1, and the light emitting device 1 is configured to generate and emit light in a wavelength range of visible light (i.e., 380 nm-780 nm). The light adjusting layer 2 is configured to block blue light in a predetermined wavelength range (i.e., partial wavelength range of blue light) when subjected to a predetermined external stimulus, and to allow all light in the wavelength range of visible light to pass through when the predetermined external stimulus is removed.

In an embodiment, the light adjusting layer 2 includes a photonic crystal. In an embodiment, the light adjusting layer 2 includes a responsive photonic crystal.

In the present disclosure, the photonic crystal refers to an artificial and periodic dielectric structure having photonic band gap (PBG for short) characteristics, and sometimes refers to a PBG photonic crystal structure. The so-called photonic bandgap means that light in a certain frequency range cannot propagate in this periodic structure, i.e. the structure itself has a "forbidden band".

The responsive photonic crystal refers to a photonic crystal of which the position and width of the photonic band gap can be changed as external environment changes. There are many kinds of external stimuli that can drive the change of the optical characteristics of the light adjusting layer 2, including: temperature, chemical reagents, mechanical forces, light, electric fields, magnetic fields, etc.

In the technical solution of the present disclosure, the light adjusting layer 2 is configured to block blue light in a predetermined wavelength range when subjected to a predetermined external stimulus, and to allow blue light in the predetermined wavelength range to pass through when the predetermined external stimulus is removed. It should be noted that the predetermined external stimulus in the present disclosure may be a combination of one or more of temperature stimulus, chemical reagent stimulus, mechanical force stimulus, optical stimulus, electric field stimulus, and magnetic field stimulus.

The light adjusting layer 2 is located on the light emitting side of the light emitting device 1. When an external stimulus is applied to the light adjusting layer 2, blue light having a wavelength within a predetermined wavelength range emitted by the light emitting device 1 cannot pass through (transmit) the light adjusting layer 2, and at the same time, light having a wavelength outside the predetermined wavelength range can pass through (transmit) the light adjusting layer 2; when the external stimulus applied to the light adjusting layer 2 is removed, the blue light having the wavelength within the predetermined wavelength range emitted by the light emitting device 1 can pass through the light adjusting layer.

Based on the above principle, when a user wants the display device to operate in "the eye protection display mode", only a predetermined external stimulus needs to be applied to the light adjusting layer 2 in the display device, so that the blue light with the wavelength within the predetermined wavelength range cannot pass through the light adjusting layer 2, and cannot enter the eyes of the user, thereby achieving the purpose of protecting the eyes. When a user wants the display device to operate in "the normal display mode", the predetermined external stimulus applied to the light adjusting layer 2 can be removed, so that the blue light with the wavelength within the predetermined wavelength range can pass through the light adjusting layer 2 and enter the eyes of the user, and the purpose of normal display with high brightness and high color gamut can be achieved.

In the present disclosure, the light adjusting layer 2 may be provided only in a blue sub-pixel region for emitting blue light (for this case, no corresponding drawing is shown), and the sub-pixel regions of other colors are not provided with the light adjusting layer 2.

However, in consideration of the difficulty of the manufacturing process for providing the light adjusting layer 2 only in the blue sub-pixel region, in the present disclosure, the light adjusting layer 2 is formed as an entire layer (see FIG. 1), that is, the light adjusting layer 2 covers all the sub-pixels in the display device. In this case, in order to prevent the light adjusting layer 2 from blocking the light emitted from the sub-pixel regions of other colors (except blue), the light adjusting layer 2 is configured to allow the light emitted from the sub-pixel regions of other colors to pass through no matter whether the light adjusting layer 2 is subjected to a predetermined external stimulus or not. As an alternative, for light having a wavelength in the visible light wavelength range, when the light adjusting layer is subjected to a predetermined external stimulus, the light adjusting layer can block blue light having a wavelength in the predetermined wavelength range, while visible light having a wavelength outside the predetermined wavelength range can pass through the light adjusting layer 2; and when the predetermined external stimulus is removed, any light having a wavelength in the visible light wavelength range (including blue light having a wavelength in the predetermined wavelength range) can pass through the light adjusting layer 2.

In some embodiments, the predetermined wavelength range includes: 420 nm to 450 nm. The wavelength range of blue light ranges from 400 nm to 480 nm, and the wavelength range of blue light which is harmful to human eyes is 420 nm to 450 nm. Therefore, when the eye protection display mode is adopted, blue light with the wavelength ranging from 420 nm to 450 nm is only required to be filtered out, and blue light with other wavelengths is not filtered out, so that the display device can realize full-color display when the eye protection display mode is adopted. Of course, the predetermined wavelength range may be set and adjusted according to actual needs in the present disclosure.

In the technical solution of the present disclosure, the display device can be switched between the eye protection display mode and the normal display mode by applying the predetermined external stimulus to the light adjusting layer 2 or removing the predetermined external stimulus, and the switching process is very simple and convenient.

In some embodiments, the light adjusting layer 2 includes: an electrically responsive photonic crystal. The electrically responsive photonic crystal refers to a photonic crystal of which the position and width of a photonic bandgap can be changed when an electric field in an external environment is changed. In this case, the predetermined external stimulus refers to a stimulus that can change an electric field in which the photonic crystal is located.

Figure 2:
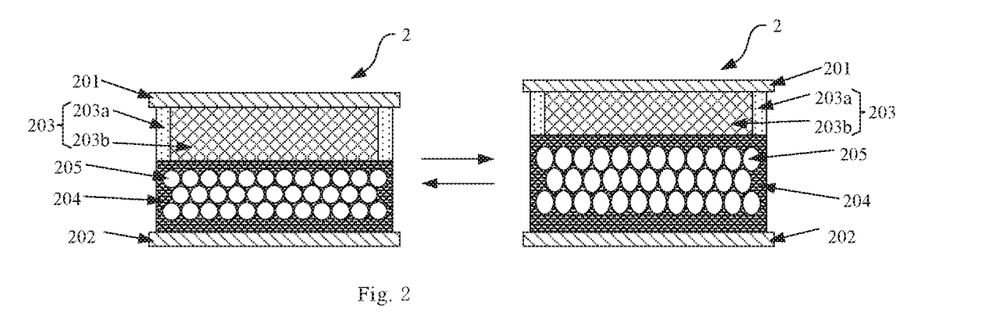
FIG. 2 are schematic diagrams of a light adjusting layer of the present disclosure when subjected to an external stimulus and when the external stimulus is removed.

FIG. 2 is schematic diagrams of the light adjusting layer 2 when it is subjected to an external stimulus (left side of FIG. 2) and when the external stimulus is removed (right side of FIG. 2) in the present disclosure. As shown in FIG. 2, as an alternative embodiment, the light adjusting layer includes: a first electrode 201, an electrolyte layer 203, an electroactive layer 204, and a second electrode 202 that are stacked, the electrolyte layer 203 and the electroactive layer 204 are between the first electrode 201 and the second electrode 202, and the first electrode 201 and the second electrode 202 may form an electric field therebetween when different voltages are applied thereto.

To ensure the overall transmittance of the light adjusting layer in the normal display mode, the first electrode 201 and the second electrode 202 can be made of a colorless transparent conductive material (e.g., indium tin oxide).

The electrolyte layer 203 includes an electrolyte 203b and a resin material 203a (e.g., epoxy resin) encapsulating the electrolyte, the electrolyte 203b may be an organic acid salt or an inorganic acid salt, and the electrolyte 203b does not react with other layers under the action of an electric field. In addition, the ionic conductivity in the electrolyte 203b is high to ensure easy realization of the migration and transport of anions and cations.

The electroactive layer 204 is a core component of the electrically responsive photonic crystal, and is mostly classified into an opal type and an inverse opal type. The microstructure of the opal is a face-centered cubic structure, is a three-dimensional photonic crystal, can generate selective Bragg reflection, and can present different colors when observed from different angles. The inverse opal is porous structures 205 formed by filling a certain electroactive material in the interstices of the opal crystal and then removing the original material of the opal crystal by calcination, dissolution or chemical corrosion, i.e., air spheres are distributed in the medium in a face-centered cubic manner.

When different voltages are applied to the first electrode 201 and the second electrode 202 to form an electric field, the electrolyte 203b flows into the electroactive layer 204 to expand the volume of the electroactive layer, so that the lattice parameter of the photonic crystal is changed, and the electric field response is realized; and when the voltages on the first electrode 201 and the second electrode 202 are changed (i.e., the voltages applied to the first electrode 201 and the second electrode 202 are the same, or no voltage is applied to the first electrode 201 and the second electrode 202) to remove the electric field, the electrolyte flowing into the electroactive layer 204 is drained out, the volume of the electroactive layer 204 is restored to the original state, and the lattice parameter of the photonic crystal is restored to the original level.

Based on the above principle, when a user wants the display device to operate in "the eye protection display mode", predetermined voltages may be applied to the first electrode 201 and the second electrode 202, respectively, so as to form a predetermined electric field between the first electrode 201 and the second electrode 202 (i.e. applying a predetermined external stimulus), so that the lattice parameter of the photonic crystal changes, and the photonic crystal at this state can block blue light with a wavelength in a predetermined wavelength range from passing through; and when the user wants the display device to operate in "the normal display mode", the lattice parameter of the photonic crystal can be restored to the original level by stopping the application of the voltages to the first electrode 201 and the second electrode 202 to remove the predetermined electric field, and the photonic crystal can allow light having a wavelength within the predetermined wavelength range to pass through.

In some embodiments, the display device is a liquid crystal display device, the liquid crystal display device includes a backlight module and a liquid crystal display panel 3, the liquid crystal display panel 3 is located on a light emitting side of the backlight module, and in this case, the light emitting device 1 is the backlight module.

The backlight module generally includes a light source, a light guide plate, and an optical film, and may further include a bezel and an adhesive for fixing the light source, the light guide plate, the optical film, and the liquid crystal display panel 3. The technical solution of the present disclosure does not limit the specific structure of the backlight module.

The liquid crystal display panel 3 includes: a first display substrate and a second display substrate assembled to form a cell, the first display substrate includes a first substrate 301, the second display substrate includes a second substrate 302, and the second substrate 302 is on a side of the first substrate 301 away from the backlight module. In an embodiment, one of the first display substrate and the second display substrate is an array substrate, and the other is a counter substrate. A liquid crystal layer, a color filter, a driving IC, and the like may be included between the first substrate 301 and the second substrate 302.

The light adjusting layer 2 may be disposed at various positions. As an optional implementation, the light adjusting layer 2 is located between the backlight module and the first substrate 301, as shown in FIG. 1. As an optional implementation, the light adjusting layer 2 is fixed on a surface of the first substrate 301 facing the backlight module through a double-sided adhesive tape; and as another optional implementation, the light adjusting layer 2 is disposed in the first substrate 301. For other implementations, they are not illustrated one by one here.

Figure 3:
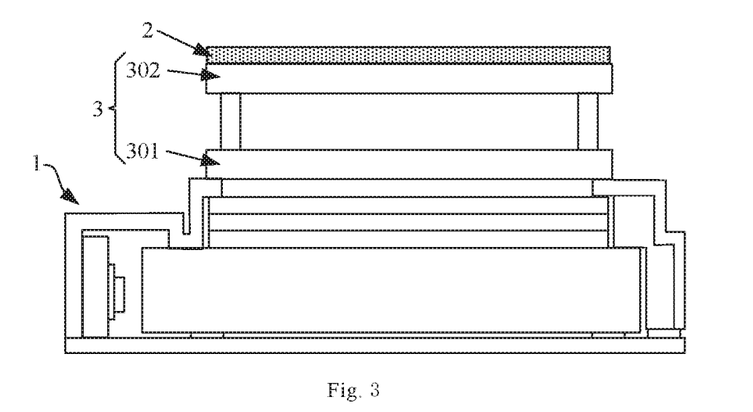
FIG. 3 is a schematic cross-sectional view of another display device according to an embodiment of the disclosure.

FIG. 3 is a schematic cross-sectional view of another display device according to an embodiment of the present disclosure, and as shown in FIG. 3, unlike in FIG. 1, the light adjusting layer 2 is located on a side of the second substrate 302 away from the backlight module in FIG. 3. As an optional implementation, the light adjusting layer 2 is fixed on a surface of the second substrate 302 away from the backlight module by a double-sided adhesive tape. For other implementations, they are not illustrated one by one here.

The case where the light adjusting layer 2 is located between the backlight module and the first substrate 301 in FIG. 1, and the case where the light adjusting layer 2 is located on the side of the second substrate 302 away from the backlight module in FIG. 3, are only for exemplary purposes, and do not limit the technical solutions of the present disclosure. In the present disclosure, the light adjusting layer 2 may also be disposed at other positions, and for example, the light adjusting layer 2 is disposed between the first substrate 301 and the second substrate 302 (no corresponding drawing is given).

It should be noted that, when the light adjusting layer 2 is disposed between the first substrate 301 and the second substrate 302, it should be ensured that the liquid crystal electric field in the liquid crystal display panel 3 for controlling the liquid crystal deflection does not affect the lattice parameter of the photonic crystal in the light adjusting layer 2, and the predetermined external stimulus applied to the light adjusting layer 2 does not affect the liquid crystal deflection.

Figure 4:
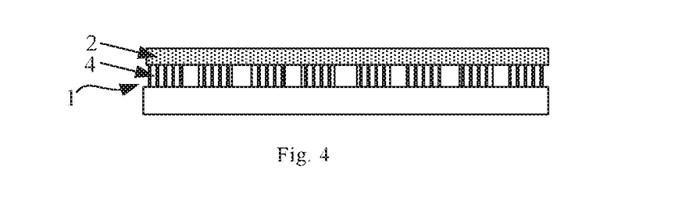
FIG. 4 is a schematic cross-sectional view of yet another display device according to an embodiment of the disclosure.

FIG. 4 is a schematic cross-sectional view of yet another display device according to an embodiment of the present disclosure, and as shown in FIG. 4, unlike the previous embodiments, the display device is an organic light emitting diode (OLED) display device, and the OLED display device includes: an organic light emitting diode display panel including an organic light emitting diode array (including a plurality of OLEDs 4), and the light emitting device 1 is the organic light emitting diode array.

It should be noted that, in the organic light emitting diode display panel in this embodiment, the organic light emitting diode 4 directly emits color light, or the organic light emitting diode 4 emits white light and then the emitted white light passes through the color filter to generate color light, and both of the above cases should belong to the protection scope of the present disclosure.

Figure 5:
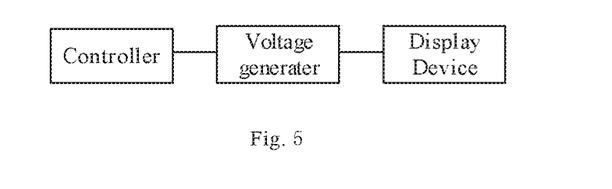
FIG. 5 is a structural block diagram of a display system according to an embodiment of the present disclosure.

FIG. 5 is a structural block diagram of a display system according to an embodiment of the present disclosure, and as shown in FIG. 5, the display system includes a display device which is the display device according to the previous embodiments. For the description of the display device, reference may be made to the foregoing description, and details are not repeated herein.

In some embodiments, the display system further includes: a controller and a voltage generator. The voltage generator is coupled between the controller and the light adjusting layer and configured to apply a voltage to the light adjusting layer in response to control by the controller. Herein, applying the predetermined external stimulus to the light adjusting layer may include applying a voltage to the light adjusting layer, and removing the predetermined external stimulus from the light adjusting layer may include stopping applying the voltage to the light adjusting layer.

In an embodiment, the controller includes a physical key or a virtual key. The user can control the voltage generator by operating the controller, thereby realizing the control of the display mode of the display device. In a case where the controller includes the physical key, the physical key may be integrated on the display device or on a remote controller that can control the display device. In a case where the controller includes a virtual key, the virtual key may be a virtual key displayed on a screen of a display terminal (e.g., a mobile phone, a tablet or a display screen), and the display terminal that displays the virtual key may send a corresponding control instruction to the voltage generator when a user operates the virtual key. For example, the physical key (or virtual key) may include a first key corresponding to "the normal display mode" of the display device and a second key corresponding to "the eye protection display mode" of the display device.

The voltage generator may be either integrated on the display device or may be independent of the display device.

As a specific implementation, referring to FIG. 2, when the light adjusting layer 2 includes a responsive photonic crystal structure, and the light adjusting layer 2 includes: the first electrode 201, the electrolyte layer 203, the electroactive layer 204, and the second electrode 202 that are stacked (i.e., the light adjusting layer shown in FIG. 2), the voltage generator is electrically coupled to the first electrode 201 and the second electrode 202. The voltage generator is configured to supply different voltages to the first electrode 201 and the second electrode 202 to form a predetermined electric field therebetween (i.e., apply a predetermined external stimulus to the light adjusting layer) when the display device is expected to be in the eye protection display mode, and to stop supplying the voltages to the first electrode 201 and the second electrode 202 to remove the predetermined electric field (i.e., remove the predetermined external stimulus) when the display device is expected to be in the normal display mode.

In an embodiment, the same voltage may also be supplied to the first electrode 201 and the second electrode 202 when the display device is expected to be in the normal display mode.

In practical applications, the display device may be designed to operate in the normal display mode by default when the display device is turned on, and a user can switch the display device to the eye protection display mode according to needs (e.g., when the display device is in a long-term use state or is used by a child).

Figure 6:
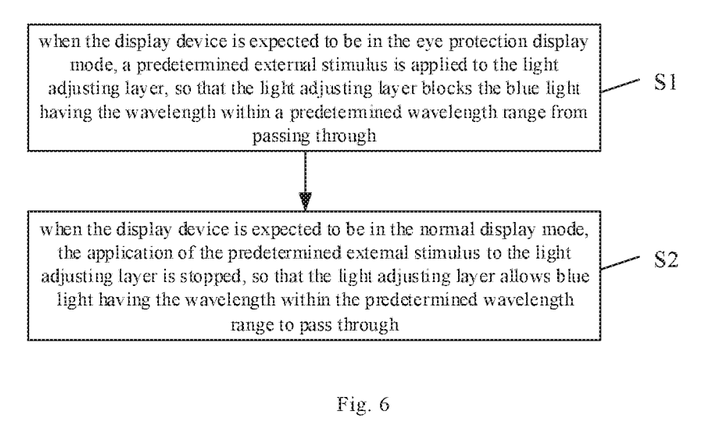
FIG. 6 is a flowchart of a display method according to an embodiment of the disclosure.

FIG. 6 is a flowchart of a display method according to an embodiment of the present disclosure, and as shown in FIG. 6, the display method is based on the display device according to the foregoing embodiments, and the display method may include the following steps.

In step S1, when the display device is expected to be in the eye protection display mode, a predetermined external stimulus is applied to the light adjusting layer, so that the light adjusting layer blocks the blue light having the wavelength within a predetermined wavelength range from passing through.

In step S2, when the display device is expected to be in the normal display mode, the application of the predetermined external stimulus to the light adjusting layer is stopped, so that the light adjusting layer allows the blue light having the wavelength within the predetermined wavelength range to pass through.

It is understood that, by touching or pressing the second key corresponding to "the eye protection display mode", the voltage generator may be controlled to apply different voltages to the first electrode 201 and the second electrode 202 of the light adjusting layer 2 (i.e., to apply the predetermined external stimulus to the light adjusting layer), so that the light adjusting layer blocks blue light having the wavelength within the predetermined wavelength range from passing through. Similarly, by touching or pressing the first key corresponding to "the normal display mode", the voltage generator may be controlled to stop applying the voltages to the light adjusting layer 2 (i.e., to remove the predetermined external stimulus from the light adjusting layer), so that the light adjusting layer allows all light in the visible light range to pass through.

By alternately executing the above steps S1 and S2, the display device can be switched between "the eye protection display mode" and "the normal display mode".

In the technical solution of the present disclosure, the display device can be switched between the eye protection display mode and the normal display mode by applying the predetermined external stimulus to the light adjusting layer or removing the predetermined external stimulus from the light adjusting layer, and the switching process is very simple and convenient.

It could be understood that the above embodiments are merely exemplary embodiments employed to illustrate the principle of the present disclosure, and the present disclosure is not limited thereto. It will be apparent to those skilled in the art that various changes and modifications can be made without departing from the spirit and scope of the present disclosure, and these changes and modifications are also considered to be within the protection scope of the present disclosure.

What is claimed is:

1. A display device, comprising: a light emitting device and a light adjusting layer, the light adjusting layer being on a light emitting side of the light emitting device, and the light emitting device being configured to generate and emit light having a wavelength in a wavelength range of visible light, wherein
   the light adjusting layer is configured to block light having a wavelength in a partial wavelength range of blue light from passing through in response to the light adjusting layer being subjected to an external stimulus and allow the light having the wavelength in the partial wavelength range of blue light to pass through in response to removing the external stimulus, and
   the light adjusting layer comprises a responsive photonic crystal.

2. The display device of claim 1, wherein the light adjusting layer comprises: an electrically responsive photonic crystal.

3. The display device of claim 2, wherein the light adjusting layer comprises: a first electrode, an electrolyte layer, an electroactive layer, and a second electrode that are stacked;
   the electrolyte layer and the electroactive layer are between the first electrode and the second electrode, an electric field is formed between the first electrode and the second electrode in response to different voltages being applied to the first electrode and the second electrode; and
   the electrolyte layer and the electroactive layer are configured such that electrolyte in the electrolyte layer flows into the electroactive layer to cause that a lattice parameter of the photonic crystal in the electroactive layer is changed, and the photonic crystal blocks the light having the wavelength in the partial wavelength range of blue light from passing through, in response to different voltages being applied to the first electrode and the second electrode to form the electric field; and the electrolyte flowing into the electroactive layer is drained out to cause that the lattice parameter of the photonic crystal in the electroactive layer is restored to an original state, and the photonic crystal allows the light having the wavelength in the partial wavelength range of blue light to pass through, in response to removing the electric field.

4. The display device of claim 1, wherein the display device further comprises a liquid crystal display panel, the light emitting device is a backlight module, and the liquid crystal display panel is on a light emitting side of the backlight module.

5. The display device of claim 4, wherein the liquid crystal display panel comprises a first display substrate and a second display substrate assembled to form a cell, the first display substrate comprising a first substrate, the second display substrate comprising a second substrate on a side of the first substrate away from the backlight module,
   wherein the light adjusting layer is between the backlight module and the first substrate, or
   the light adjusting layer is on a side of the second substrate away from the backlight module, or
   the light adjusting layer is between the first substrate and the second substrate.

6. The display device of claim 1, wherein the display device is an organic light emitting diode display device, the organic light emitting diode display device comprises an organic light emitting diode display panel comprising an organic light emitting diode array, and
   the light emitting device is the organic light emitting diode array.

7. The display device of claim 1, wherein the partial wavelength range is from 420 nm to 450 nm.

8. A display system, comprising the display device of claim 1.

9. The display system of claim 8, wherein the display system further comprises a controller and a voltage generator;
   the controller is configured to control whether the voltage generator generates a voltage in response to an operation of a user; and
   the voltage generator is configured to apply an external stimulus to the light adjusting layer by generating the voltage, and to stop applying the external stimulus to the light adjusting layer by not generating the voltage.

10. The display system of claim 9, wherein the light adjusting layer comprises a first electrode, an electrolyte layer, an electroactive layer and a second electrode that are stacked, the voltage generator is electrically coupled to the first electrode and the second electrode, and the voltage generator applies the external stimulus to the light adjusting layer by respectively applying different voltages to the first electrode and the second electrode to form an electric field between the first electrode and the second electrode, and stops applying the external stimulus to the light adjusting layer by stopping applying the voltages to the first electrode and the second electrode.

11. The display system of claim 9, wherein the controller comprises: a physical key or a virtual key.

12. A display method, the display method being based on the display device of claim 1, and the display method comprising:
- in a case that the display device is expected to be in an eye protection display mode, applying the external stimulation to the light adjusting layer, so that the light adjusting layer blocks light having the wavelength in the partial wavelength range of blue light from passing through; and
- in a case that the display device is expected to be in a normal display mode, stopping applying the external stimulus to the light adjusting layer, so that the light adjusting layer allows the light having the wavelength in the partial wavelength range of blue light to pass through.

\* \* \* \* \*